United States Patent [19]

Lentine

[11] Patent Number: 5,093,565
[45] Date of Patent: Mar. 3, 1992

[54] APPARATUS FOR SEQUENTIAL OPTICAL SYSTEMS WHERE AN INDEPENDENTLY CONTROLLABLE TRANSMISSION GATE IS INTERPOSED BETWEEN SUCCESSIVE OPTOELECTRONIC GATES

[75] Inventor: Anthony L. Lentine, St. Charles, Ill.

[73] Assignee: AT&T Bell Laboratories, Murray Hill, N.J.

[21] Appl. No.: 555,126

[22] Filed: Jul. 18, 1990

[51] Int. Cl.$^5$ .............................................. H01J 31/50
[52] U.S. Cl. ................................. 250/213 A; 377/102
[58] Field of Search ............ 250/213 A, 211 R, 214 R, 250/208.2; 307/311; 377/102

[56] References Cited

U.S. PATENT DOCUMENTS

| Re. 32,893 | 3/1989 | Miller . | |
|---|---|---|---|
| 4,689,793 | 8/1987 | Liu et al. | 250/213 A |
| 4,754,132 | 6/1988 | Hinton et al. | 250/211 J |
| 4,800,262 | 1/1989 | Lentine | 250/213 A |
| 4,985,621 | 1/1991 | Aull et al. | 250/213 A |

Primary Examiner—David C. Nelms
Assistant Examiner—Khaled Shami
Attorney, Agent, or Firm—Ross T. Watland

[57] ABSTRACT

An optoelectronic apparatus where information is communicated to and from the apparatus in the optical domain, but where the apparatus includes a transmission gate advantageously interposed between successive optoelectronic gates to sequentially convey information internally in the form of electrical, rather than optical, signals. Illustratively, the transmission gate is optoelectronic and comprises two back to back p-i-n photodiodes each including a quantum well region. The first and second optoelectronic gates are S-SEEDs comprising p-i-n photodiodes also each including a quantum well region. The transmission gate is responsive to a first level of the optical control signal for substantially blocking current, and to a second level of the optical control signal for substantially passing current. Applications of the apparatus include its use in a shift register, 2×1 switch, 1×2 switch, and an exclusive OR gate.

26 Claims, 7 Drawing Sheets

APPARATUS FOR SEQUENTIAL OPTICAL SYSTEMS WHERE AN INDEPENDENTLY CONTROLLABLE TRANSMISSION GATE IS INTERPOSED BETWEEN SUCCESSIVE OPTOELECTRONIC GATES

TECHNICAL FIELD

This invention relates to optoelectronic apparatus.

BACKGROUND AND PROBLEM

To make competitive optical computers and photonic switches, optical devices are required that perform functions that are similar to the functions performed by electronic devices in electronic systems. By using optoelectronic devices, such as the quantum well self electro-optic effect devices (SEEDs) disclosed in U.S. Re. Pat. No. 32,893 issued to D. A. B. Miller on Mar. 21, 1989, many such corresponding functions can be achieved. The symmetric SEEDs (S-SEEDs) disclosed in U.S. Pat. No. 4,754,132 issued to H. S. Hinton et al. on June 28, 1988 have been shown to operate as set-reset latches, differential logic gates, or optical tri-state logic devices (U.S. Pat. No. 4,800,262 issued to A. L. Lentine on Jan. 24, 1989). More recently, S-SEEDs have been applied as logic gates capable of implementing any boolean logic function in a single combinational circuit with a single clock cycle of delay (allowed U.S. patent application Ser. Nos. 07/399,638 and 07/399,730 of A. L. Lentine et al.). This is important because it avoids the optical cascading otherwise needed to perform more complex logic functions; the approach is lacking, however, in that there is no apparent way to implement sequential circuits, such as shift registers, counters, multiplexers and demultiplexers.

Allowed U.S. patent application Ser. No. 07/283,336 of H. S. Hinton et al. discloses one known sequential optical circuit apparatus comprising optically cascaded S-SEEDs in an integrated structure; while the monolithic structure eliminates the need for the bulk optics of free space optically interconnected subsystems, the structure is complex, and adds capacitance thereby reducing system speed. Because the devices are optically cascaded, it is not possible in some applications to use short pulses to rapidly switch the devices because of saturation of the first device of a cascaded pair. In view of the foregoing, a recognized deficiency in the art is the lack of an apparatus for implementing optical sequential logic without requiring optical cascading.

SOLUTION

This deficiency is eliminated and a technical advance is achieved in accordance with the principles of the invention in an apparatus where information is communicated to and from the apparatus in the optical domain, but where the apparatus includes a transmission gate advantageously interposed between successive optoelectronic gates to sequentially convey information internally, significantly in the form of electrical, rather than optical, signals. Since there is no need to optically cascade component gates, the apparatus construction is simplified because there is no need to align the optical output of one gate for transmission as the optical input to a second gate. Switching speed is improved since the structure is of reduced size and therefore reduced capacitance compared to the known Hinton et al. monolithic structure and since there is no tendency to overdrive and thereby saturate a first gate in order to provide sufficient optical input power to a second gate.

An apparatus in accordance with the invention includes first and second optoelectronic gates and a transmission gate. The first optoelectronic gate has a logical state controllable by an optical input signal and generates an electrical signal representative of the logical state. The transmission gate is electrically coupled to the first optoelectronic gate and selectively transmits the electrical signal. The second optoelectronic gate is electrically coupled to the transmission gate and has an optical state controllable by the selectively transmitted electrical signal.

In an illustrative embodiment, the transmission gate is optoelectronic, responsive to an optical control signal, and comprises two back to back p-i-n photodiodes each including a quantum well region. The first and second optoelectronic gates are S-SEEDs comprising p-i-n photodiodes also each including a quantum well region. The transmission gate is electrically coupled from a point between the p-i-n photodiodes of the first S-SEED gate to a point between the p-i-n photodiodes of the second S-SEED gate. The transmission gate is responsive to a first level of the optical control signal for substantially blocking current, and to a second level of the optical control signal for substantially passing current.

In a mode referred to as non-cascaded operation, the optical control signal and the optical input signal are applied substantially simultaneously. However, in a cascaded mode of operation, the optical control signal is applied after the optical input signal is applied. When the first optoelectronic gate is implemented as an S-SEED, an optical signal is applied to the first gate during the application of the optical control signal to the transmission gate.

An optical shift register in accordance with the invention comprises N optoelectronic processing gates arranged in sequence and N−1 optoelectronic transmission gates each being electrically interposed between successive ones of the N processing gates, N being a positive integer greater than two. Each processing gate has an optical state controllable by an optical input signal and controllable by an electrical input signal, and generates an electrical signal representative of optical state. Each transmission gate is responsive to an optical control signal and selectively transmits an electrical signal between the successive processing gates. The shift register is responsive to optical control signals applied sequentially to successive transmission gates for shifting information represented by the optical state of one processing gate to successive processing gates of the shift register.

Further illustrative apparatus in accordance with the invention includes a 2×1 switch and a 1×2 switch. The 2×1 switch, which is usable, for example, as a multiplexer or as an exclusive OR gate, comprises first, second, and third optoelectronic gates, and first and second transmission gates. The first optoelectronic gate has a logical state controllable by a first optical input signal and generates a first electrical signal representative of the logical state. The first transmission gate is electrically coupled to the first optoelectronic gate and selectively transmits the first electrical signal. The second optoelectronic gate has a logical state controllable by a second optical input signal and generates a second electrical signal representative of the logical state. The second transmission gate is electrically coupled to the second optoelectronic gate and selectively transmits the second electrical signal. The third optoelectronic gate is electrically coupled to the first and second transmission gates and has an optical state that is controllable by the selectively transmitted first electrical signal, and is controllable by the selectively transmitted second electrical signal.

The 1×2 switch, which is usable, for example, as a demultiplexer, also comprises first, second, and third optoelectronic gates, and first and second transmission gates. The first optoelectronic gate has a logical state controllable by an optical input signal and generates an electrical signal representative of the logical state. The first transmission gate is electrically coupled to the first optoelectronic gate and selectively transmits the electrical signal. The second optoelectronic gate is electrically coupled to the first transmission gate and has an optical state that is controllable by the electrical signal selectively transmitted by the first transmission gate. The second transmission gate is electrically coupled to the first optoelectronic gate and selectively transmits the electrical signal generated by the first optoelectronic gate. The third optoelectronic gate is electrically coupled to the second transmission gate and has an optical state that is controllable by the electrical signal selectively transmitted by the second transmission gate.

DETAILED DESCRIPTION

Figure 1:
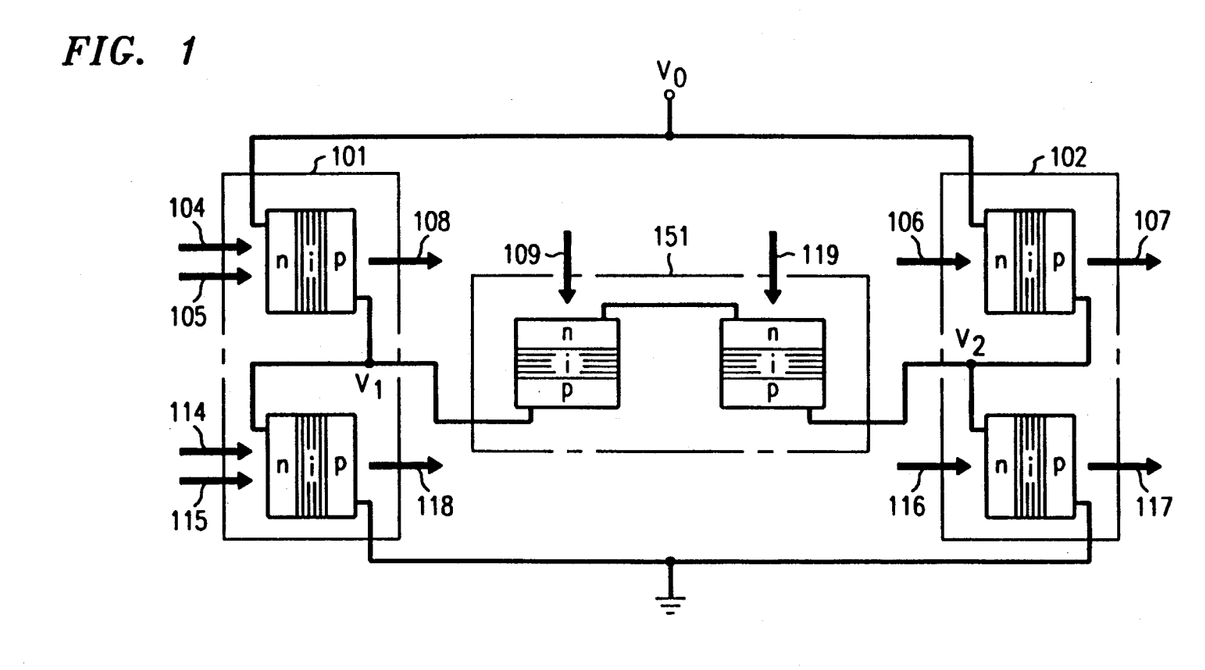
FIG. 1 is a circuit diagram of an exemplary apparatus in accordance with the invention comprising two optoelectronic signal processing gates and an electrically interposed, optoelectronic transmission gate.
Figure 7:
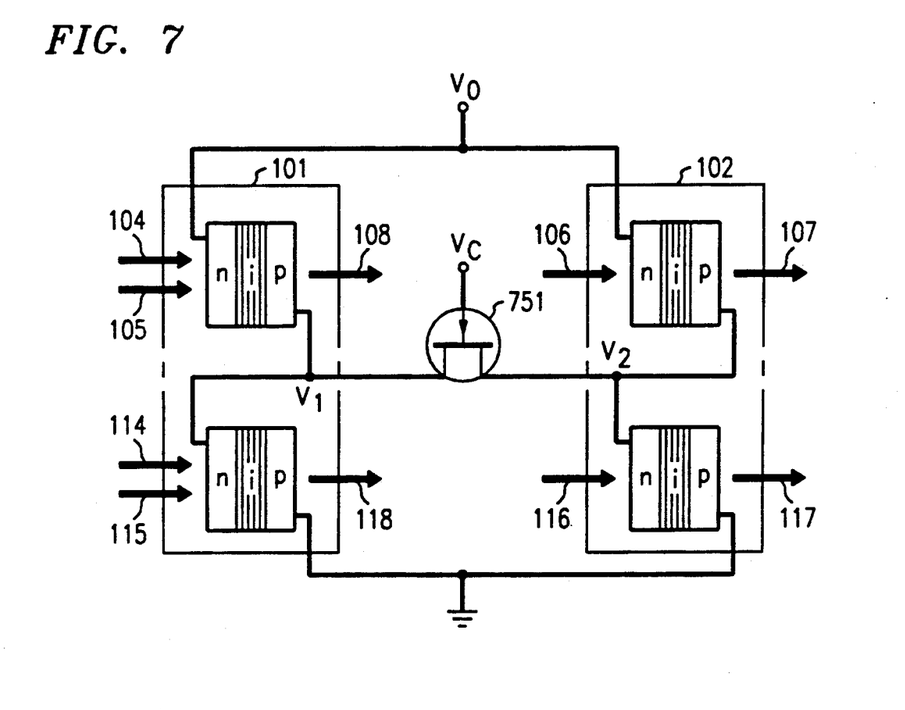
FIG. 7 is an alternative embodiment of the apparatus of FIG. 1 where the transmission gate is electronic and responsive to an electrical signal $V_c$.

FIG. 1 is a circuit diagram of an exemplary embodiment of the invention, comprising two optoelectronic signal processing gates, 101, 102 and an optoelectronic transmission gate 151 electrically connected between gates 101 and 102. In this embodiment gates 101, 102 are implemented using symmetric self electro-optic effect devices (S-SEEDs). The logical state of optical processing gate 101 is represented by an internal voltage $V_1$, which controls the voltage across the multiple quantum well (MQW) intrinsic regions in the S-SEED of gate 101. Each of the optical gates 101, 102 has one or more optical outputs that also represent the logical state of the device. The logical state of gate 102 is represented by an internal voltage $V_2$, which controls the voltage across the MQW regions in the S-SEED of gate 102. Thus, the logical states of gates 101, 102 are represented by both electrical and optical states although the optical output beams from gates 101, 102 are not used in the present embodiment. Optoelectronic transmission gate, 151 operates as an open circuit without incident light and as a short circuit with incident light. Several elements are applicable as optical transmission gate 151. Among these are back to back photodiodes, FET phototransistors, bipolar phototransistors, and photoconductors. An electrically controlled transmission gate, e.g. a FET, may also be used as shown in FIG. 7. If the optoelectronic processing gates are SEEDs and if the transmission gate is implemented using back to back quantum well p-i-n diodes, the entire apparatus may be implemented with only one type of device (i.e. MQW diodes), making circuit fabrication simple.

In the present embodiment, optical processing gates 101, 102 are S-SEEDs comprising serially connected p-i-n diodes with quantum wells in the intrinsic region, and transmission gate 151 comprises two back to back p-i-n photodiodes which may be identical to the quantum well diodes used in the S-SEEDs. There are two modes of operation referred to herein as cascaded operation and non-cascaded operation. In cascaded operation, a complementary set of input beams, 104, 114, first sets the state of S-SEED 101. Input beams 104, 114 essentially determine $V_1$. A set of clock beams, 105, 115, is then applied to S-SEED 101 to provide output beams, 108, 118. Clock beams 105, 115, do not substantially alter the optical state or the voltage $V_1$ of S-SEED 101. At the same time a set of transfer beams, 109, 119, is applied to transmission gate 151 to transfer the voltage $V_1$ on the center node of S-SEED 101 to the center node of S-SEED 102. Now $V_2 = V_1$. In this implementation, if the transfer beams 109, 119, are applied without the clock beams, 105, 115, S-SEED 101 will likely lose its state; however if the optical processing gates are more complex than S-SEEDs and hold their state indefinitely without incident light beams, only the transfer beams would need to be applied. Lastly, a set of clock beams, 106, 116, incident on S-SEED 102 provides a set of output beams, 107, 117, representative of the optical state of S-SEED 102. This operation provides the functional equivalent of cascading optical processing gates. The cascading is not done by routing the optical outputs from one gate to the inputs of the next gate, but is electrical in that the voltage representing the state of the first gate is applied directly to the second gate.

In the non-cascaded mode of operation, transfer beams 109, 119 are applied concurrently with the signal beams incident on S-SEED 101, essentially "shorting" $V_1$ and $V_2$ so that the signal beams determine the voltage on $V_1$ and $V_2$ at the same time. Subsequently, clock beams 106, 116 are applied to S-SEED 102 to provide output beams 107, 117. Operation in a non-cascaded mode eliminates the need for clock beams 105, 115 and requires only one clock cycle of delay rather than two. However, since both $V_1$ and $V_2$ are switched with the input signals 104, 114 in the non-cascaded mode of operation, more input signal energy is required. The specific application determines whether cascaded or non-cascaded operation is preferable.

Figure 2:
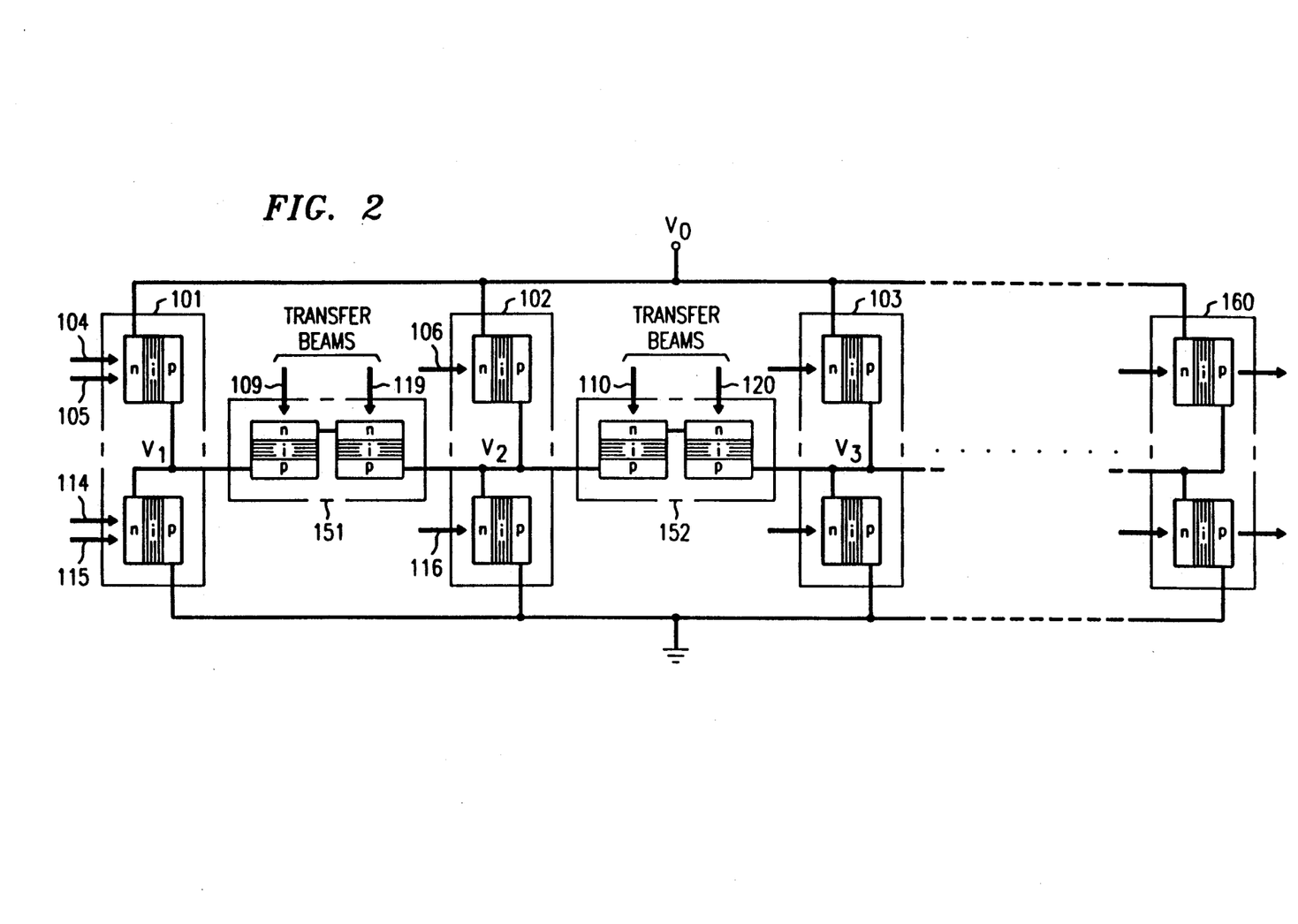
FIG. 2 is a circuit diagram of an illustrative optical shift register in accordance with the invention.

The operation of optoelectronic transmission gates may be better understood by considering their application in several exemplary optical systems. As a first example, consider an optical shift register comprising N optical processing gates with N−1 transmission gates as illustrated in FIG. 2. Operation of the shift register is an extension of the cascaded operation described above. As above, first the input beams 104, 114 set the state of S-SEED 101. Clock beams 105, 115 and transfer beams 109, 119 are then applied transferring the data from S-SEED 101 to S-SEED 102. Clock beams 106, 116 and transfer beams 110, 120 are subsequently applied and the data is transferred to S-SEED 103. This process continues until the data is transferred to the last S-SEED 160 in the shift register. Like other shift registers, half of the data transfers take place during one half clock cycle and the other half take place during the complement half clock cycle. Thus clock beams 106, 116 are complements of clock beams 105, 115; transfer beams 110, 120 are complements of transfer beams 109, 119. Data can be read in or out in parallel to every other S-SEED thereby performing serial to parallel or parallel to serial conversion.

Note that the shift register can shift data from left to right as described above by having the odd (even) numbered transfer beams applied concurrently with the odd (even) numbered clock beams. The shift register can shift data from right to left by having the odd (even) numbered transfer beams applied concurrently with the even (odd) numbered clock beams.

Figure 3:
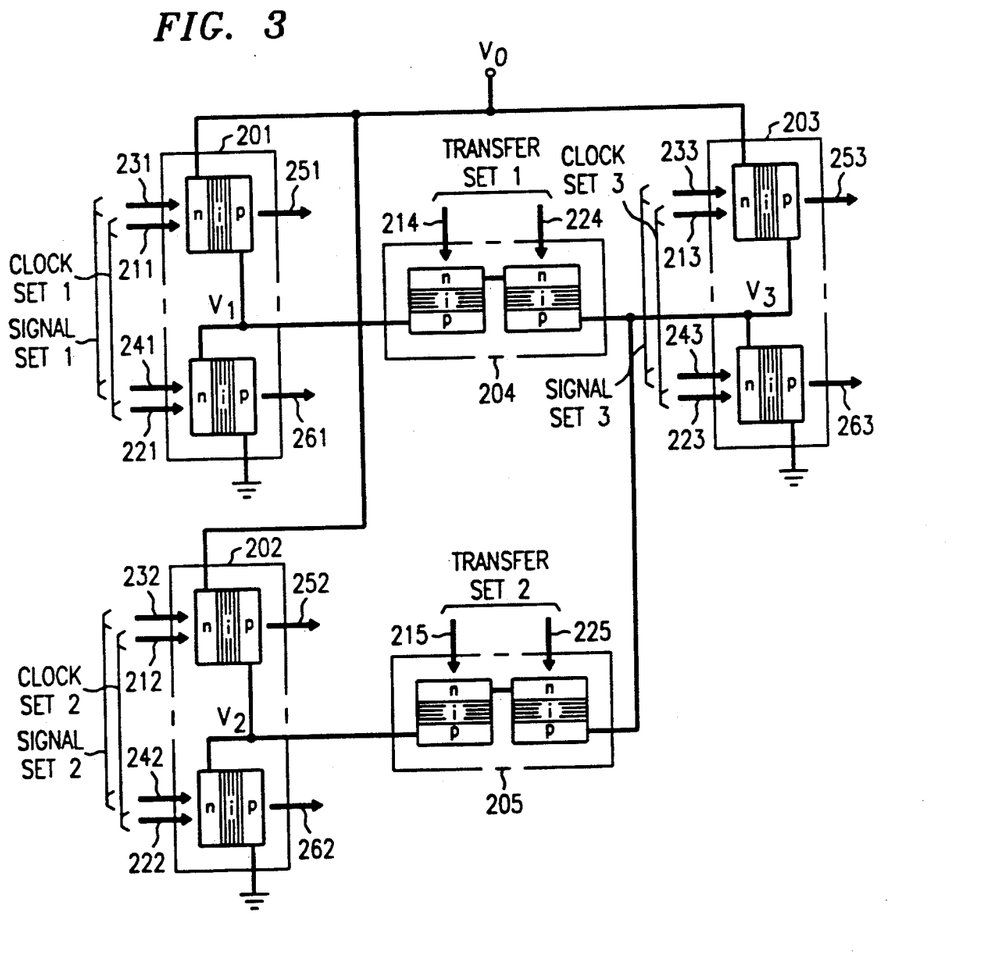
FIG. 3 is a circuit diagram of a further exemplary apparatus usable as a 2×1 switch or as a 1×2 switch.

As a second example, consider the 2×1 switch shown in FIG. 3. The switch can be operated in either a cascaded or non-cascaded mode. S-SEEDs 201, 202 act as input S-SEEDs for two sets of input signals, signal set 1 (231,241) and signal set 2 (232,242). These signals set the state of S-SEEDs 201, 202 and thus voltages $V_1$ and $V_2$. If transfer beam set 1 (214,224) is applied to transmission gate 204 while clock beam set 1 (211,221) is applied to S-SEED 201, (and optionally clock set 2 (212,222) is applied to S-SEED 202), $V_3=V_1$. Similarly, if transfer beam set 2 (215,225) is applied to transmission gate 205 while (optionally clock beam set 1 (211,221) is applied to S-SEED 201), and clock set 2 (212,222) is applied to S-SEED 202, $V_3=V_2$. Thus, one of two inputs is selected; the apparatus operates as a 2×1 switch.

The transmission gates are also operable in a non-cascaded mode thus eliminating the need for clock beam sets 1 (211,221) and 2 (212,222). To select input set 1, transfer beam set 1 (214,224) is turned on and transfer beam set 2 (215, 225) is turned off, essentially shorting $V_1$ and $V_3$. At the same time, signal set 1 (231,241) is applied to set $V_1$ and $V_3$ concurrently. Even though signal set 2 (232, 242) may also have been applied, because transfer beam set 2 (215,225) was turned off, signal set 2 does not effect $V_3$. Clock beams 213, 223 are then applied to S-SEED 203 to read the output state of the 2×1 switch.

The functionality of a 1×2 switch is obtained by operating the 2×1 switch in reverse; in cascaded operation, signal set 3 (233,243) is applied to S-SEED 203, transfer set 1 or transfer set 2 is applied to transfer the data to either S-SEED 201 or 202, and the appropriate clock set 1 or 2 is applied. This 1×2 switch can be operated in a non-cascaded mode as well.

Any arbitrary interconnection network may be obtained from 2×1 switches. For medium to large networks, operation should be in a cascaded mode; otherwise the voltage on many nodes must be changed at once. For non-cascaded operation, the capacitance associated with each node requires larger energies of the signal beams, although there would only be one clock cycle of delay through the entire network. For cascaded operation, the capacitance associated with each node is only slightly greater than that of a single S-SEED. Accordingly, smaller signal beam energies are required and there are N clock cycle delays through an N stage interconnection network. A four-directional shift register may also be obtained from the 1×2 and 2×1 switches; operation should be in a cascaded mode.

Figure 4:
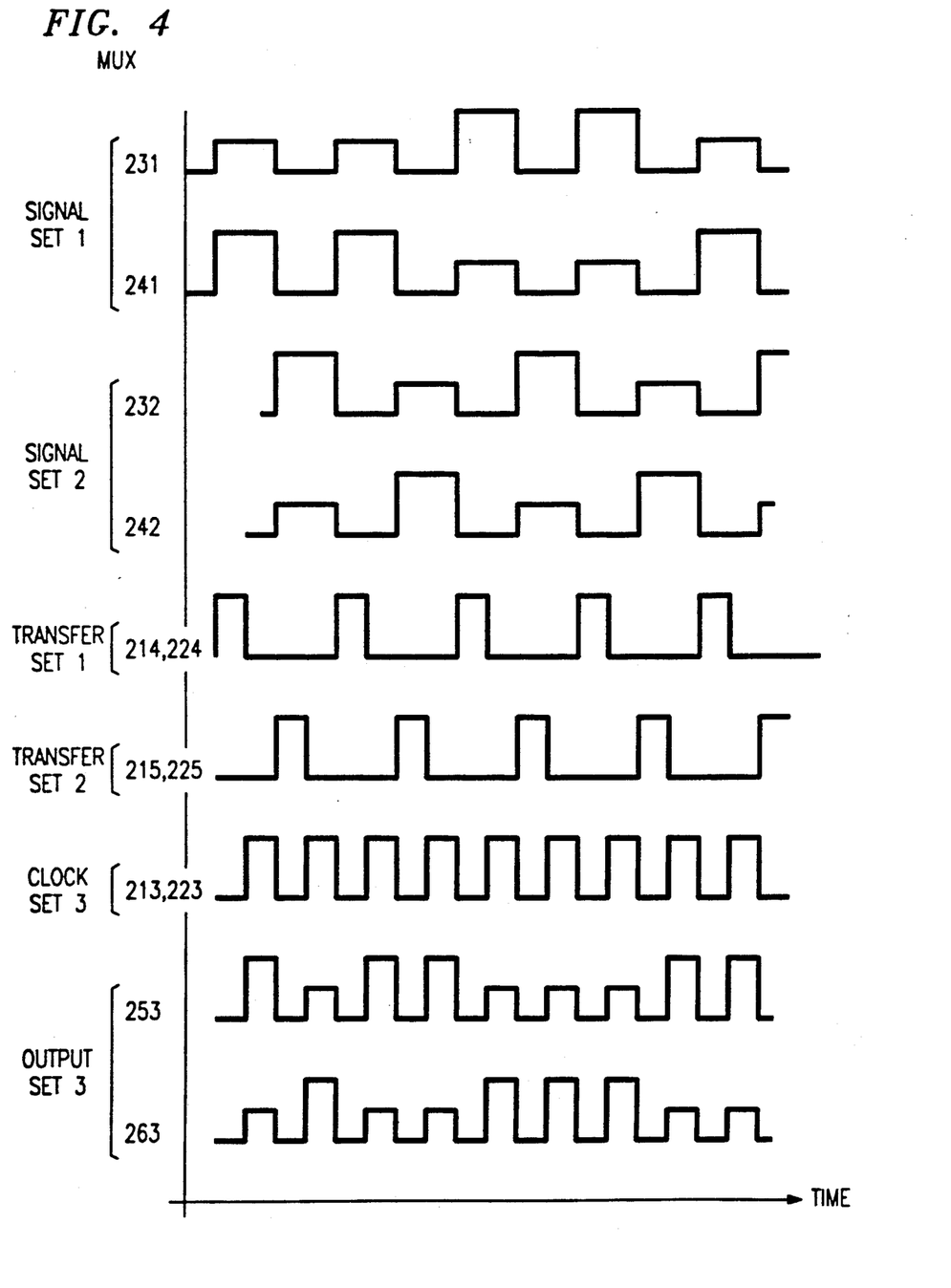
FIG. 4 is a timing diagram associated with use of the apparatus of FIG. 3 as a multiplexer.

The 2×1 and 1×2 switches may be extended to N×1 and 1×N switches. An N×1 time multiplexer (mux) and a 1×N demultiplexer (demux) may also be obtained. This is illustrated for a 2×1 mux and 1×2 demux. For a 2×1 mux, the input and output beams are the same as the input and output beams for a 2×1 switch; however, the timing is different. A timing diagram is shown in FIG. 4. In operation, the two signal sets 1 and 2 are applied sequentially. (If the two input signal sets are received concurrently, one of the sets may be clocked through an additional S-SEED.) First input signal set 1 is applied. During the first half of the interval when signal set 1 is applied, transfer set 1 is also applied, thus setting $V_3$ to the voltage determined by signal set 1. During the second half of this half clock cycle, output clock set 3 (213,223) is turned on to produce an output representative of the data from input signal set 1. Then input signal set 2 is applied. During the first half of the interval where signal set 2 is applied, transfer set 2 is also applied, thus setting $V_3$ to the voltage determined by signal set 2. During the second half of this half clock cycle, output clock set 3 is turned on to produce an output representative of the data from input set 2. Considering the output set 3 (253,263) produced in response to clock set 3, the odd numbered bits are representative of the data from input set 1 and the even numbered bits are representative of the data from input set 2. The data rate is twice that of each incoming bit stream.

Figure 5:
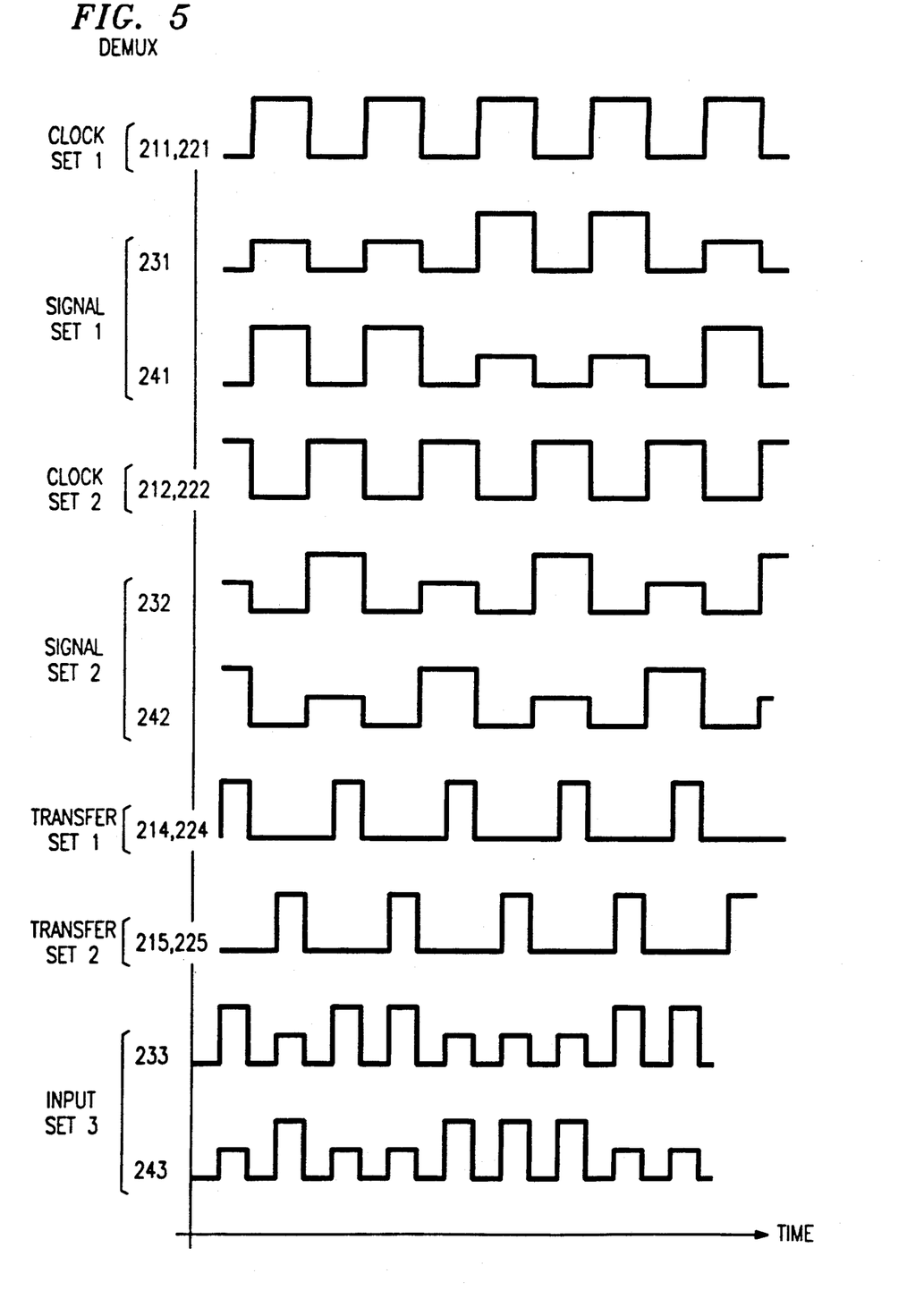
FIG. 5 is a timing diagram associated with use of the apparatus of FIG. 3 as a demultiplexer.

A 2×1 demux may be obtained using the apparatus of FIG. 3 by applying timing signals in accordance with the timing diagram of FIG. 5. In this application, there is only one set of input signal beams (input set 3; 233, 243) incident on S-SEED 203; every odd bit is transmitted to S-SEED 201 and every even bit is transmitted to S-SEED 202. When the first input bit is present on S-SEED 203, transfer beam set 1 is turned on, thus setting $V_1$ and $V_3$ equal to the voltage determined by that first input bit. Then clock beam set 1 is turned on and transfer beam set 1 is turned off; the state of S-SEED 201 is thereby made the same as the state of S-SEED 203. When the second input bit is present on S-SEED 203, transfer beam set 2 is turned on, thus setting $V_2$ and $V_3$ equal to the voltage determined by that second bit. Then clock beam set 2 is turned on and transfer beam set 2 is turned off; the state of S-SEED 202 is thereby made the same as the state of S-SEED 203. Note that the two outputs are sequential, not concurrent; the outputs can be made concurrent by passing one output through an addition S-SEED.

Figure 6:
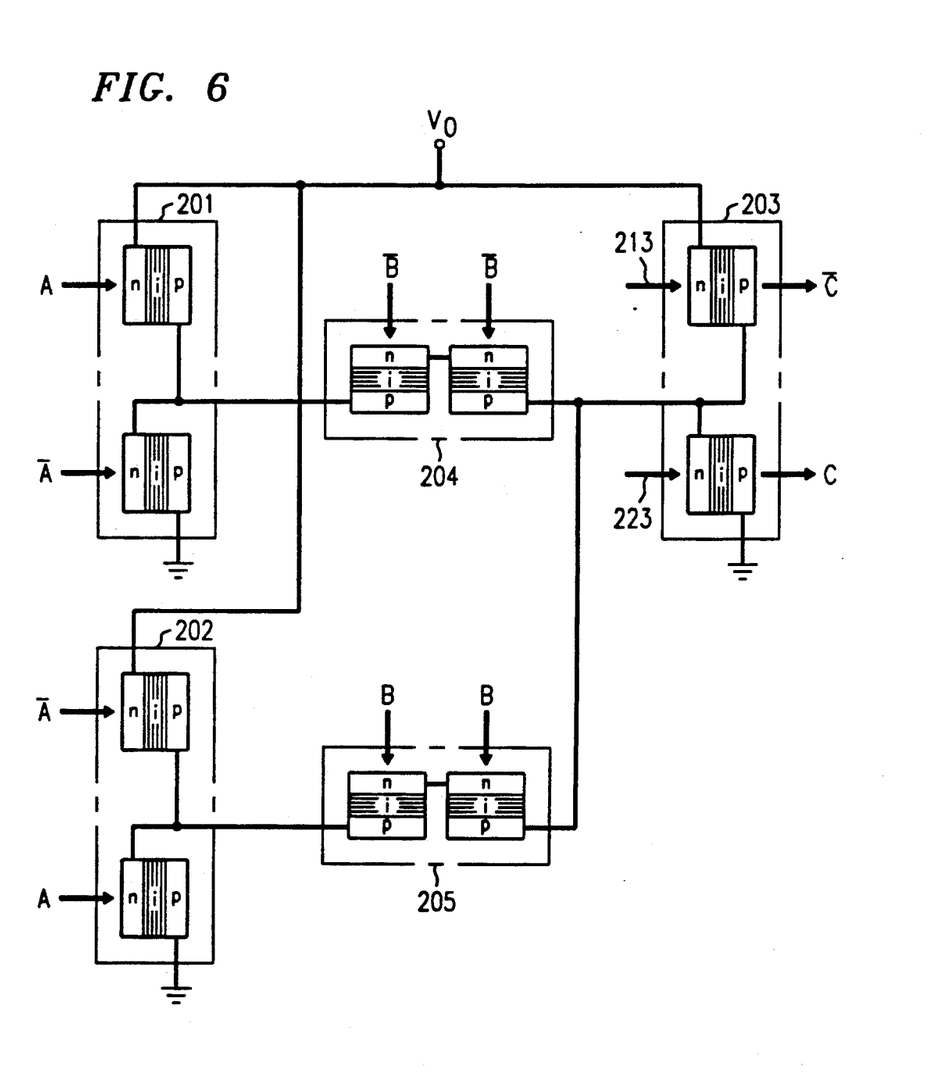
FIG. 6 is another circuit diagram of the apparatus of FIG. 3 with the signals relabelled for use of the apparatus to perform an exclusive OR logic function.

A further application of the apparatus of FIG. 3 is as an exclusive OR gate implementing the logical function $C=A\bar{B},+\bar{A}B$. The logical output of an exclusive OR is one if the two inputs differ and zero if the two inputs are the same. Input signal beams 231, 242 (FIG. 3) are set equal to A (FIG. 6). Input signal beams 232, 241 (FIG. 3) are set equal to $\bar{A}$ (FIG. 6). Transfer beams 214, 224 (FIG. 3) are set equal to $\bar{B}$ (FIG. 6). Transfer beams 215, 225 (FIG. 3) are set equal to B (FIG. 6). Only clock beams 213, 223 are used; output beam 263 is equal to C and output beam 253 is equal to $\bar{C}$. A variety of other logic functions may be implemented using this technique.

The preceding arrangements using optical transmission gates to interconnect optical processing gates differ from known arrangements using electrical transmission gates to interconnect electrical processing gates. In the electrical domain, specific logic levels are defined. In the electrooptic circuits, specific voltage levels are defined as well; however, the logic decisions are based upon the ratios of the optical input powers, not the absolute levels. Because the gain mechanism in electronics is different than in the optical implementation, different noise margins and fan-out/fan-in requirements are applicable. The use of optics eliminates clock skew since all clock beams are applied perpendicular to the circuit. In electronics, the clock beams propagate in the plane of the circuits. As stated previously, the optoelectronic circuits allow the use of short pulses for the clock beams, leading to faster processing than would be possible with electronics alone.

It is to be understood that the above-described embodiments are merely illustrative of the principles of the invention and that many variations may be devised by those skilled in the art without departing from the spirit and scope of the invention. It is therefore intended that such variations be included within the scope of the claims.

I claim:

1. Apparatus comprising
   first optoelectronic gate means having a logical state controllable by an optical input signal and for generating an electrical signal representative of said logical state of said first optoelectronic gate means,
   transmission gate means electrically coupled to said first optoelectronic gate means and responsive to a control signal independent of said first optoelectronic gate means for selectively transmitting said electrical signal, and
   second optoelectronic gate means electrically coupled to said transmission gate means and having an optical state controllable by said selectively transmitted electrical signal.

2. Apparatus in accordance with claim 1 where said transmission gate means is electronic and said control signal is an electrical control signal for selectively transmitting said electrical signal generated by said first optoelectronic gate means.

3. Apparatus in accordance with claim 1 where said transmission gate means is optoelectronic and said control signal is an optical control signal for selectively transmitting said electrical signal.

4. Apparatus in accordance with claim 3 where said optical control signal and said optical input signal are applied substantially simultaneously.

5. Apparatus in accordance with claim 3 where said optical control signal is applied after said optical input signal is applied.

6. Apparatus in accordance with claim 3 wherein said transmission gate means is responsive to a first level of said optical control signal for substantially blocking current, and to a second level of said optical control signal for substantially passing current.

7. Apparatus in accordance with claim 3 where an optical signal is being applied to said first gate means during the application of said optical control signal to said transmission gate means.

8. Apparatus in accordance with claim 3 wherein said transmission gate means comprises two p-i-n photodiodes connected back to back.

9. Apparatus in accordance with claim 8 wherein each of said two photodiodes includes a quantum well region.

10. Apparatus in accordance with claim 1 wherein said first optoelectronic gate means comprises a self electro-optic effect drive.

11. Apparatus in accordance with claim 10 wherein said device comprises a symmetric self electro-optic effect device.

12. Apparatus in accordance with claim 1 wherein said first optoelectronic gate means comprises first and second photodetector means connected in series across a voltage source, and said electrical signal generated by said first optoelectronic gate means comprises a voltage at a point between said first and second photodetector means.

13. Apparatus in accordance with claim 12 wherein each of said first and second photodetector means comprises a p-i-n photodiode.

14. Apparatus in accordance with claim 12 wherein each of said first and second photodetector means comprises a p-i-n photodiode including a quantum well region.

15. Apparatus in accordance with claim 1 wherein said second optoelectronic gate means comprises a self electro-optic effect device.

16. Apparatus in accordance with claim 15 wherein said device comprises a symmetric self electro-optic effect device.

17. Apparatus in accordance with claim 1 wherein said second optoelectronic gate means comprises first and second p-i-n photodiodes connected in series across a voltage source, and said selectively transmitted electrical signal is a voltage applied at a point between said first and second photodetector means, each of said first and second photodiodes including a quantum well region.

18. Apparatus in accordance with claim 1 wherein said first optoelectronic gate means comprises first and second p-i-n photodiodes connected in series across a voltage source, and said electrical signal generated by said first optoelectronic gate means comprises a voltage at a point between said first and second photodiodes,
   wherein said transmission gate means is optoelectronic, is responsive to an optical control signal for selectively transmitting said voltage, and comprises third and fourth p-i-n photodiodes connected back to back,
   wherein said second optoelectronic gate means comprises fifth and sixth p-i-n photodiodes connected in series across a voltage source, and said selectively transmitted electrical signal is said voltage applied at a point between said fifth and sixth photodiodes, each of said first, second, third, fourth, fifth, and sixth photodiodes including a quantum well region.

19. Apparatus in accordance with claim 18 wherein said optical input signal comprises an optical input beam applied to said first photodiode and a complementary optical input beam applied to said second photodiode and said optical control signal comprises first and second optical clock beams concurrently applied to said third and fourth photodiodes, respectively.

20. Apparatus in accordance with claim 19 wherein third and fourth optical clock beams are applied to said first and second photodiodes, respectively, during the application of said first and second optical clock beams to said third and fourth photodiodes, respectively.

21. Apparatus in accordance with claim 20 wherein fifth and sixth optical clock beams are applied to said fifth and sixth photodiodes, respectively, to develop an optical output beam from said fifth photodiode and a complementary optical output beam from said sixth photodiode.

22. An optical shift register comprising

N optoelectronic processing gate means arranged in a sequence, each having an optical state controllable by an optical input signal and controllable by an electrical input signal and for generating an electrical signal representative of optical state, N being a positive integer greater than two, and N−1 optoelectronic transmission gate means each being electrically interposed between successive ones of said N processing gate means and being responsive to an optical control signal for selectively transmitting an electrical signal between the successive processing gate means, said shift register being responsive to optical control signals applied sequentially to successive ones of said N−1 transmission gate means for shifting information represented by the optical state of one of said N processing gate means to successive ones of said N processing gate means.

23. A shift register in accordance with claim 22 further comprising means for transmitting optical input signals in parallel to set the optical state of a plurality of said N processing gate means.

24. A shift register in accordance with claim 22 further comprising means for transmitting optical clock signals in parallel to read the optical state of a plurality of said N processing gate means.

25. Apparatus comprising first optoelectronic gate means having a logical state controllable by a first optical input signal and for generating a first electrical signal representative of said logical state of said first optoelectronic gate means, first transmission gate means electrically coupled to said first optoelectronic gate means for selectively transmitting said first electrical signal, second optoelectronic gate means having a logical state controllable by a second optical input signal and for generating a second electrical signal representative of said logical state of said second optoelectronic gate means, second transmission gate means electrically coupled to said second optoelectronic gate means for selectively transmitting said second electrical signal, and third optoelectronic gate means electrically coupled to said first and second transmission gate means and having an optical state controllable by said selectively transmitted first electrical signal and controllable by said selectively transmitted second electrical signal.

26. Apparatus comprising first optoelectronic gate means having a logical state controllable by an optical input signal and for generating an electrical signal representative of said logical state of said first optoelectronic gate means, first transmission gate means electrically coupled to said first optoelectronic gate means for selectively transmitting said electrical signal generated by said first optoelectronic gate means, second optoelectronic gate means electrically coupled to said first transmission gate means and having an optical state controllable by said electrical signal selectively transmitted by said first transmission gate means, second transmission gate means electrically coupled to said first optoelectronic gate means for selectively transmitting said electrical signal generated by said first optoelectronic gate means, and third optoelectronic gate means electrically coupled to said second transmission gate means and having an optical state controllable by said electrical signal selectively transmitted by said second transmission gate means.

* * * * *